(12) United States Patent
Hoult et al.

(10) Patent No.: US 6,913,794 B2
(45) Date of Patent: Jul. 5, 2005

(54) DIODE-LASER CURING OF LIQUID EPOXIDE ENCAPSULANTS

(75) Inventors: Anthony P. Hoult, Los Gatos, CA (US); Scott J. Crane, Aromas, CA (US)

(73) Assignee: Coherent, Inc., Santa Clara, CA (US)

( * ) Notice: Subject to any disclaimer, the term of this patent is extended or adjusted under 35 U.S.C. 154(b) by 292 days.

(21) Appl. No.: 10/050,724

(22) Filed: Jan. 14, 2002

(65) Prior Publication Data

US 2003/0131932 A1 Jul. 17, 2003

(51) Int. Cl.[7] .............................. C08J 7/18; C08J 7/04; C08F 2/50; C08F 2/46; B05D 3/02
(52) U.S. Cl. ..................... 427/521; 427/559; 427/554
(58) Field of Search ................. 427/521, 512, 427/557, 559, 554

(56) References Cited

U.S. PATENT DOCUMENTS

| | | | |
|---|---|---|---|
| 4,615,765 A | * 10/1986 | Levinson et al. | |
| 4,676,586 A | 6/1987 | Jones et al. | 350/96.2 |
| 4,733,039 A | 3/1988 | Schnable et al. | 219/121 LD |
| 5,242,715 A | * 9/1993 | Schoen et al. | 427/559 |
| 5,457,299 A | 10/1995 | Blais et al. | 219/121.85 |
| 5,484,979 A | 1/1996 | Gao | 219/121.64 |
| 5,517,359 A | 5/1996 | Gelbart | 359/623 |
| 5,756,689 A | * 5/1998 | Busman et al. | 534/560 |
| 5,972,562 A | 10/1999 | Tani et al. | 430/280.1 |
| 6,007,664 A | 12/1999 | Kuizenga et al. | 156/272.8 |
| 6,159,657 A | * 12/2000 | Fleming et al. | 430/270.1 |
| 6,180,315 B1 | * 1/2001 | Schädeli | 427/554 |
| 6,214,276 B1 | * 4/2001 | Gelbart | 264/401 |
| 6,278,078 B1 | 8/2001 | Walvoord et al. | 219/121.61 |
| RE37,875 E | * 10/2002 | Lawton | 427/521 |
| 2002/0047003 A1 | * 4/2002 | Beding Aom et al. | 219/388 |
| 2004/0223042 A1 | * 11/2004 | Goto | 347/118 |
| 2004/0231540 A1 | * 11/2004 | Hiller | 101/401.1 |

FOREIGN PATENT DOCUMENTS

| | | | |
|---|---|---|---|
| DE | 196 40 006 A1 | 9/1996 | H01L/21/56 |
| WO | WO 97/16482 | 5/1997 | |

OTHER PUBLICATIONS

Translation of DE 196 46 006 A1 to Reeh et al, Apr. 2, 1998.*
In PCT/US02/41322, filed Dec. 23, 2002, a copy of the "Notification of Transmittal of the International Search Report or the Declaration," mailed Mar. 31, 2003, 7 pages in length.

* cited by examiner

Primary Examiner—Marianne Padgett
(74) Attorney, Agent, or Firm—Stallman & Pollock LLP

(57) ABSTRACT

A method of encapsulating an integrated-circuit component supported on a substrate comprises depositing on the component a thermally curable liquid organic matrix in sufficient quantity to form a layer covering the component. The liquid matrix layer is irradiated by laser radiation having a wavelength between about 600 and 1000 nanometers. The liquid matrix includes one or more additive materials that are strongly absorbing for the wavelength of the laser radiation. The liquid matrix layer is irradiated with the laser radiation for a time period sufficient to cure the matrix layer.

14 Claims, 3 Drawing Sheets

DIODE-LASER CURING OF LIQUID EPOXIDE ENCAPSULANTS

TECHNICAL FIELD OF THE INVENTION

The present invention relates generally to thermally convertible liquid organic matrixes, such as formulated liquid epoxide encapsulants, adhesives and coating compounds. The invention relates in particular to converting (curing) such a liquid matrix by exposing the liquid matrix to laser radiation having a wavelength between about 660 and 1000 nm.

DISCUSSION OF BACKGROUND ART

Thermally converted formulated liquid epoxide encapsulants, adhesives and coating compounds are extensively used within the electronics industry for bonding and encapsulating integrated circuit (IC), diode, and other microelectronic packages to printed circuit boards (PCBs). This is due to their unparalleled mechanical strength, adhesion properties and environmental stability, which combine to give excellent protection to electronic circuitry assembled on a PCB. Such liquid epoxide adhesives and encapsulants, also widely known in the industry as "glob-top" or chip-on-board (COB) encapsulants, have evolved into very sophisticated products used in very high production volumes. In one encapsulating procedure, a controlled volume of the encapsulant or adhesive is dispensed onto the top of a silicon IC ("die" or "chip") located on the PCB. The encapsulant is then thermally converted to a fully crosslinked hard polymer network.

One major application area for this "glob-top" technique is in encapsulation of an IC or chip on a credit-card-sized plastic card. Following the encapsulation, the chip-carrying card is laminated with a similar sized card to form a credit card or other transaction card including the chip. The chip may be a microprocessor chip containing memory and a microprocessor. The chip can either be a microprocessor with internal memory or a memory chip with non-programmable logic. Connection to the chip is made either via direct physical contact, or remotely via a contactless electromagnetic interface. Such cards are often referred to in the electronics industry as "smart cards".

In a typical procedure for encapsulating an IC chip to such a card, the chip is placed in position on the card and a predetermined volume ("glob") of the premixed liquid epoxide encapsulant is accurately dispensed onto the chip. The volume of encapsulant is determined according to the dimensions of the chip to provide a layer of the encapsulant covering or encapsulating the chip. The card including the encapsulant-covered chip is then passed into an oven for thermal curing of the encapsulant to a fully crosslinked hard polymer network. A typical oven-curing operation for such an encapsulant or adhesive in the volume involved has a duration of between about two and eight hours depending on the type of encapsulant. Temperature rise and fall times during the curing operation must be carefully controlled. In many commercially available curing ovens it is necessary to maintain an inert gas atmosphere, such as a nitrogen atmosphere, in the oven. This is especially necessary for encapsulants in which an anhydride is included to promote curing.

The requirement for oven-curing of the liquid epoxide encapsulants adds considerably to the cost of manufacturing "smart-cards". The ovens are expensive, occupy a relatively large volume of production space, for example, about 30 cubic meters ($m^3$), and consume a relatively large amount of energy, for example, about 5 Kilowatts for an oven capable of curing 100 bonds per hour on cards having width of 75 millimeters (mm) and a length of 125 mm. Further, the form of the ovens makes them unsuitable for integration into an electronic assembly line. This requires that partly finished cards be taken from such an assembly line, processed as a batch in the curing oven, and then returned to the assembly line for completion. There is clearly a need for a liquid epoxide curing method that does not require such an oven-curing operation and that can be easily integrated into an electronic production line.

SUMMARY OF THE INVENTION

The present invention is directed to a method of thermally curing a thermally curable organic liquid matrix. In one aspect, the inventive method comprises providing a source of laser radiation having a wavelength between about 600 and 1000 nanometers (nm). One or more materials that are light absorbing at the wavelength of the laser radiation are included in the thermally curable liquid organic matrix. The laser radiation from the source is directed into the light-absorbing-material-containing thermally curable liquid organic matrix, until the thermally curable organic matrix is hardened.

Thermally convertible (curable) liquid organic matrixes suitable for curing by the method of the present invention include epoxides and other crosslinkable monomers. Suitable light absorbing materials include carbon black, dyes, pigments, and even powdered metals.

The method of the present invention is particularly applicable to encapsulating an integrated circuit component supported on a substrate. In one such encapsulating method incorporating the method of the present invention, a sufficient amount of the liquid organic matrix is deposited on the component to form a layer of the liquid organic matrix covering the component and contacting the substrate. The laser radiation is directed onto the layer of organic matrix for a time period sufficient that the resin is cured.

Preferably the light absorbing materials added to the thermally convertible liquid organic matrix are sufficiently light absorbing that at least 15 percent and more preferable about 70 percent or greater of the laser radiation can be absorbed by the liquid organic matrix layer. Further, the matrix should contain a sufficiently small percentage of the light absorbing materials so that the curing or mechanical strength of the resin is not affected by addition of the material. The laser radiation wavelength between about 600 and 1000 nm is selected because most basic thermally convertible liquid matrixes are intrinsically transparent (essentially non absorbing) at wavelengths in this range. This allows absorption of the laser radiation in the resin to be controlled by the above-discussed light-absorbing additive materials. Further, laser radiation in this wavelength can be generated by diode-lasers. Such lasers have a high electrical-to-optical conversion efficiency compared with other laser types.

In one example of the inventive method, diode-laser radiation having a wavelength of 808 nm and delivered in a 15 mm beam at power density between 3 and 4 Watts per square centimeter ($W/cm^2$) cures a thermally convertible liquid epoxide layer on a 10 millimeter (mm) IC chip in two minutes. This is sixty times faster than would be possible using oven curing. It is estimated that, under production conditions of about 100 encapsulations per hour, the inventive curing method can be at least eighty times more energy efficient than oven curing. Other advantages and applications of the inventive method will be evident to one skilled in the art from the detailed description of the invention provided hereinbelow.

BRIEF DESCRIPTION OF THE DRAWINGS

The accompanying drawings, which are incorporated in and constitute a part of the specification, schematically illustrate a preferred embodiment of the present invention, and together with the general description given above and the detailed description of the preferred embodiment given below, serve to explain the principles of the present invention.

DETAILED DESCRIPTION OF THE INVENTION

Figure 1:
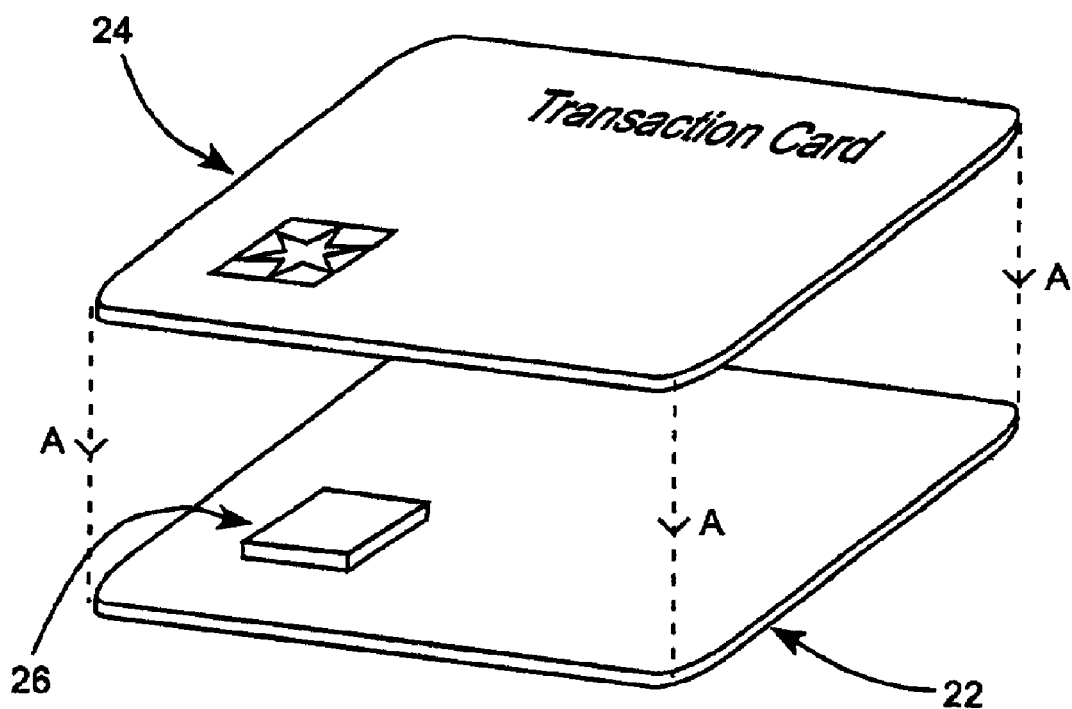
FIG. 1 is an exploded, perspective view schematically illustrating a transaction card having a substrate and a cover and including an integrated circuit chip bonded to the substrate.

Referring now to the drawings, wherein like features are designated by like reference numerals, FIG. 1 schematically illustrates an example of a transaction card 20 having a substrate 22 with an IC chip 26 bonded thereon, and a cover 24. After IC chip 26 is bonded to substrate 22 and connected to other circuit components (not shown) the IC chip is encapsulated by the organic liquid matrix conversion method of the present invention and a cover 24 is laminated to substrate 22.

Figure 2:
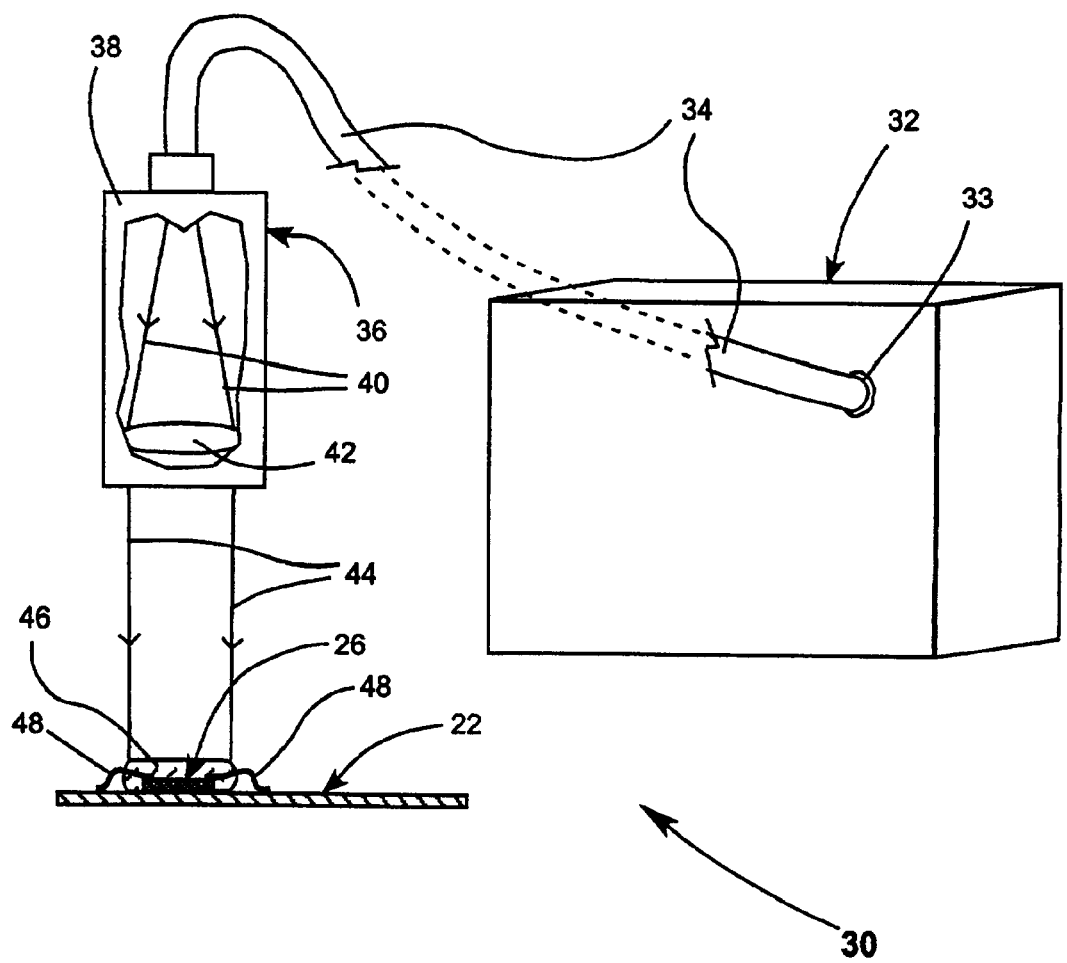
FIG. 2 schematically illustrates one preferred embodiment of the method of the present invention for encapsulating the integrated circuit chip bonded to the substrate in the transaction card of FIG. 1, the method employing a laser spot projection apparatus for delivering laser radiation to a liquid resin globule covering the integrated circuit chip.

FIG. 2 depicts an example of apparatus 30 arranged for carrying out a preferred embodiment of the present invention for encapsulating IC chip 26 on a substrate 22. Apparatus 30 includes a diode-laser unit 32. Diode-laser unit 32 includes a high-power diode-laser array or diode-laser bar (not shown) the output of which is delivered to an optical-fiber connector 33. One suitable diode-laser unit capable of delivering up to 30 Watts (W) of diode-laser radiation is a FAP™ system available from Coherent®, Inc. of Santa Clara, Calif.

An optical fiber bundle 34 delivers the output of diode-laser unit 32 to a beam projector unit 36 in a housing 38 (shown partly cut away). Diode-laser radiation leaves optical fiber 34 as an expanding beam 40. Projector unit 36 includes a lens 42 arranged to collimate beam 40, thereby delivering a collimated beam 44 for use in the inventive bonding method. Projector unit 36 provides a radiation spot having a diameter of about 15 mm.

IC chip 26 is located on substrate 22 and a globule or layer 46 of a premixed liquid epoxide resin is arranged to cover the chip. Typically the IC chip is attached to the substrate by a die-attach adhesive, solder or the like. The chip is preferably covered with a thickness of resin sufficient to provide adequate encapsulation when cured, but not so thick as to extend the curing time of the resin. A preferred coverage-thickness for a 10.0 mm square chip having a thickness of about 1 mm is about 25.0 $\mu$m. Wire bonds 48 are soldered to the chip before the resin globule is applied.

The resin formulation includes relatively small quantities of one or more additive materials that absorb the wavelength of the laser radiation provided by diode-laser unit 30 and thereby cause the resin to absorb the laser radiation. The terminology "relatively small quantities" as used here with reference to the light absorbing materials means that the quantities of additive materials, individually or collectively, are insufficient to adversely affect the mechanical strength of the cured resin.

One preferred wavelength for use in the method of the present invention is 808 nm. One reason for this is that diode-laser arrays arranged to emit at this wavelength for pumping solid-state lasers are readily available commercially. The above-exemplified commercial diode-laser unit delivers radiation at this wavelength.

Materials that will cause liquid epoxide encapsulants to absorb at 808 nm include carbon black, dyes, and pigments. A metal powder, such silver powder or aluminum powder, dispersed in the liquid resin may also provide sufficient absorption if the particle size is less 100 micrometers ($\mu$m). Carbon black and a commercial gray dye MG97 are often added to such resins for "hiding" components encapsulated by the resin. One commercially available, premixed, liquid epoxide resin including both of these materials in quantities suitable for the inventive resin-curing method is available as type EO 1062 resin from the Dexter Corporation of Carlsbad, Calif.

Beam 42 from projection unit 36 is delivered to resin layer 46. Preferably, the width of the beam at the globule is at least sufficient to cover chip 26 and more preferably is about 50% wider. This provides sufficient coverage to expose essentially the entire area of globule 40 to the radiation.

Preferably, there should be sufficient of the light-absorbing materials in the resin globule such that at least about 15% and more preferably about 70% or greater of diode laser radiation is absorbed in the resin layer. This allows the radiation to penetrate the entire layer to the interfaces of the layer with the chip and the substrate. For the carbon black and MG97 materials discussed above, in a layer of resin having a thickness of 25 this can be achieved with less than 1% by volume of the light absorbing materials being present in the resin. Quantities necessary for other light-absorbing materials and layer thicknesses can be determined photometrically, by experiment.

Preferably, the laser radiation has a wavelength between about 600 and 1000 nanometers (nm). This is because most basic single part liquid resins are transparent at wavelengths in this range. This allows absorption of the laser radiation in the resin to be controlled by the above-discussed additive materials. Such an ability to control absorption of the resin allows the absorption of the resin to be varied for optimally curing layers of different size and thickness. Intrinsic absorption properties of resins may be such that wavelengths outside this preferred range are either very strongly absorbed or weakly absorbed. The absorption can be sufficiently strong that radiation can not penetrate the resin globule or sufficiently weak that insufficient radiation is absorbed by the resin to effect the desired rapid curing.

It has been determined that the absorption of the laser radiation by the light absorbing materials in above-discussed quantities generates sufficient heat in the liquid resin that curing or hardening can be effected in about 120 seconds or less. This curing time is dependent on the size of the chip being encapsulated or, more precisely, dependent on the size of the corresponding resin layer or globule as well as the power of laser radiation and the light absorption of the resin. By way of example, a 10 mm chip was encapsulated on a FR4 substrate using a carbon black and MG97-containing EO 1062 resin globule having a weight of about 5 grams. The resin was cured to form a hardened layer thereof in less than 120 seconds using 5 W of 808 nm radiation delivered in a 15 mm-diameter beam, i.e., at a power density of between 3 and 4 Watts per square centimeter ($W/cm^2$).

In an initial part of the curing period, outgassing of the liquid resin can take place. If this outgassing is allowed to become violent, for example causing boiling of the liquid resin, degradation or even complete failure of the desired encapsulation could result. It was found that potential disadvantageous effects of this outgassing could be minimized by delivering the laser radiation to layer 46, at least in an initial portion of a curing period, in the form of repeated pulses. In the above-discussed example a pulse rate of 10 Hertz (Hz) at a duty cycle of 50% was found effective in controlling outgassing effects.

This power density is several orders of magnitude less than is required in other laser processes such as laser welding, and is sufficiently benign that the chip is not damaged by the irradiation. It should be noted that using an optical fiber to deliver laser radiation to projection unit 36 has particular advantages in the liquid organic matrix curing method of the present invention. One such advantage is that the optical fiber delivers a beam at its output end having relatively uniform intensity across its diameter, and having relatively sharp edges. This beam can then be expanded and projected, as discussed above, onto a layer of liquid organic matrix to be cured. The term "relatively uniform", here, means relative to the essentially Gaussian (nonuniform) energy distribution of a laser beam delivered directly from a laser by a conventional optical system. The uniformity of the beam delivered by optical fiber bundle 34 results from the multiple reflections that the laser radiation undertakes in traveling along the optical fiber bundle. This homogenizes the beam and essentially eliminates the possibility of "hot spots" or localized areas of very high power density (relative to the density in the rest of the beam). Such hot spots could cause uneven curing of the liquid matrix and possibly even localized weakness of a cured encapsulation.

The above-discussed example indicates that the liquid organic matrix curing method of the present invention is able to cure the liquid epoxide resin in about one sixtieth of the time that would be required to cure the resin by the above discussed prior-art oven-curing method. This improvement in processing time is accompanied by a significant improvement in energy efficiency compared with that of the prior-art oven curing method.

By way of example, calculations based on power consumption and capacity specifications for one commercial oven commonly employed for such resin curing, and based on a substrate (transaction card) size of about 77 mm by 125 mm, indicate that encapsulating a 10 mm chip by the prior art oven-curing method requires about 32 Watt Hours of electrical energy per card. In the above-described example of the resin curing method of the present invention, assuming an electric to optical conversion efficiency (wall plug efficiency) of about 40 percent for diode laser unit 32, a 10 mm chip could encapsulated on a card using only about 0.4 Watt Hours of electrical energy, or one eightieth the electrical energy required for the oven curing method. It is believed that further experimentation with different types and quantities of light-absorbing materials in the resin even further improvement in curing speed and energy-efficiency is possible.

Clearly, in a production environment, more than one laser radiation delivery apparatus or system 30 would be required to maintain an acceptable throughput. By way of example, the above-discussed commercial curing oven has a throughput of no greater than about one-hundred 77 mm by 125 mm cards (cured encapsulations thereon) per hour. The above-discussed example of apparatus 30 is capable of curing 30 encapsulations per hour. This being the case, four such systems would have a greater throughput than the commercial oven. These four systems would occupy 10% of the space of the commercial oven and would cost about 25% of the cost of the oven.

Figure 3:
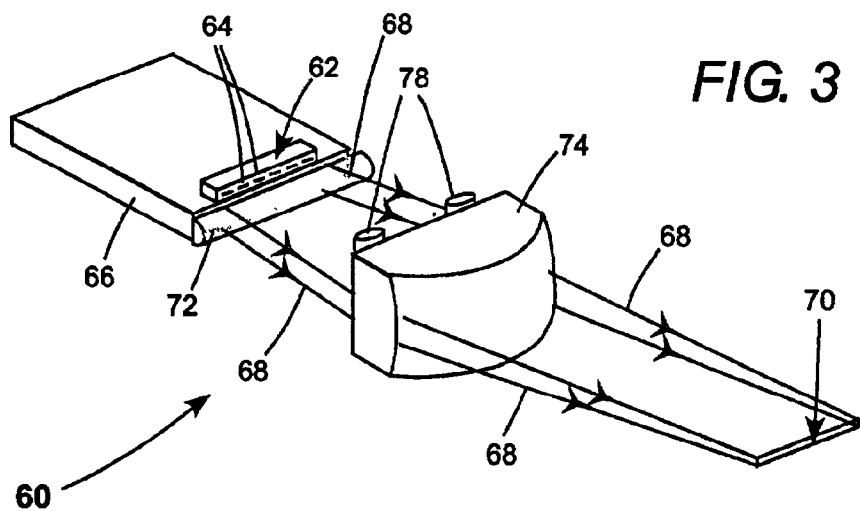
FIGS. 3 and 4 schematically illustrate another preferred embodiment of the method of the present invention used for encapsulating the integrated circuit chip bonded to the substrate in the transaction card of FIG. 1, the method employing a laser line of light projecting apparatus for delivering laser radiation as a line of radiation on a liquid resin globule covering the integrated circuit chip.
Figure 4:
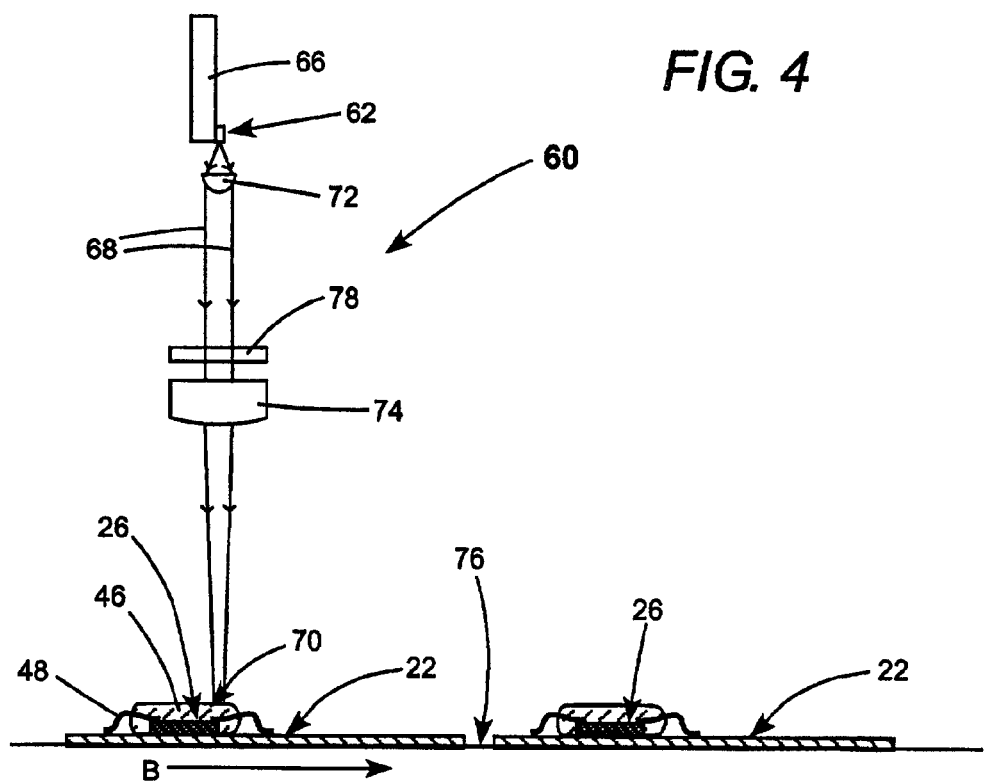

Referring now to FIGS. 3 and 4, another embodiment 60 of apparatus for carrying out the method of the present invention is illustrated. Apparatus 60 includes a diode-laser bar including an array of diode-lasers 64. Diode-laser bar 62 is mounted on a heat sink 66. Light 68 from diode-lasers 64 is formed into a line or strip of light 70 by a cylindrical lens 72 and a spherical lens 74. Line of light 70 is formed in a focal plane (not shown) of spherical lens 74. Physical stops 78 are provided for controlling light-intensity distribution along the length of line 70. A detailed description of such a line-of-light projecting apparatus is provided in co-pending application Ser. No. 09/522,120, now issued U.S. Pat. No. 6,494,371, the complete disclosure of which is hereby incorporated by reference.

Apparatus 60 is arranged such that line of light 70 is formed on a liquid resin layer 46 in an arrangement for encapsulating an IC chip 26 on a substrate 22 as described above with reference to FIG. 2. The entire volume of layer 46 is exposed to the laser radiation by placing the assembly of IC chip and substrate on a conveyor and moving the assembly as indicated in FIG. 4 by arrow B such that the layer is exposed to the laser radiation for a time sufficient that the resin layer is cured. A plurality of encapsulations can be cured by placing the substrate/IC chip assemblies on a conveyor 76. Diode-laser bar 62 can be turned off when there is no layer 46 in the path of the laser radiation.

In summary, a method of curing a thermally curable liquid organic matrix is described above. Curing of the liquid medium is effected by including in the liquid medium one or more materials that have relatively high absorption for light having a wavelength between 650 and 1000 nm and irradiating the medium with diode-laser light having a wavelength in the same wavelength range.

Thermally curable media for which the inventive method is suitable include epoxides and other crosslinkable monomers. Suitable light absorbing materials include carbon black, dyes, pigments and finely divided metals.

It should be noted here that application of the inventive curing method is not limited to the encapsulation application as described above. Other applications of the inventive curing method include curing of epoxides to bond articles together, edge sealing of organic LED displays, and localized curing and repair of composite aerospace structures. Other applications will be evident to those skilled in the art.

The present invention is described in terms of a preferred and other embodiments. The invention is not limited, however, to the embodiments described and depicted herein. Rather, the invention is limited only by the claims appended hereto.

What is claimed is:

1. A method of encapsulating an electronic component supported on a substrate, comprising the steps of:
   (a) depositing a thermally curable epoxide layer on the electronic component, the epoxide layer including therein at least one light absorbing material; and
   (b) directing laser radiation having a wavelength between about 600 and 1000 nm onto the thermally curable epoxide layer for a time period sufficient that the light absorbing material absorbs a portion of the laser radiation and generates heat in the layer, whereby the epoxide layer is cured without external heating and without non-thermal curing.

2. The method of claim 1, wherein said light absorbing material is carbon black.

3. The method of claim 1, wherein said light absorbing material is a dye.

4. The method of claim 1, wherein said light absorbing material is a powdered metal.

5. The method of claim 1, wherein said laser radiation has a wavelength of about 808 nm.

6. The method of claim 1, wherein said laser radiation is produced by a diode-laser array.

7. A method of encapsulating an electronic component supported on a substrate, comprising the steps of:
   (a) providing a diode-laser array for delivering radiation laser radiation having a wavelength between about 600 and 1000 nm;
   (b) depositing on the electronic component a thermally curable epoxide layer covering the component, the epoxide layer including therein at least one light absorbing material;
   (c) transporting said laser radiation from said diode-laser array, via an optical fiber bundle, to an optical projector for projecting said laser radiation; and
   (d) projecting said laser radiation onto said thermally curable epoxide layer for a time period sufficient that the light absorbing material absorbs a portion of the laser radiation and generates heat whereby the epoxide layer is cured without external heating and without non-thermal curing.

8. The method of claim 7, wherein said laser radiation has a wavelength of about 808 nm.

9. The method of claim 7, wherein said at least one light absorbing material is carbon black.

10. The method of claim 7, wherein during step (d) said integrated circuit component is held in a fixed relationship to said optical projector and said laser radiation is projected onto said epoxide layer in the form of a spot having a size sufficient to at least cover the electronic component.

11. A method of encapsulating an electronic component supported on a substrate, comprising the steps of:
   (a) depositing on the electronic component an amount of thermally curable epoxy compound sufficient to form a thermally curable epoxide layer thereof covering the component, the epoxide layer having included therein at least one light absorbing material;
   (b) directing laser radiation having a wavelength between about 600 and 1000 nm into an optical projector arranged to project said laser radiation in the form of a line of said laser radiation;
   (c) projecting said line of laser radiation onto said thermally curable epoxide layer; and
   d) dating step (c), moving the substrate and said integrated circuit with respect to said optical projector such that said thermally curable epoxide layer on the integrated circuit is exposed to said radiation for a time sufficient that said light absorbing material absorbs a portion of the laser radiation and generates heat in the layer whereby the thermally curable epoxide layer is cured without external heating and without non-thermal curing.

12. The method of claim 1, wherein said laser radiation is produced by a diode-laser array.

13. The method of claim 1, wherein said at least one light absorbing material is carbon black.

14. A method of encapsulating an electronic component supported on a substrate, comprising the steps of:
   (a) depositing on the electronic component a thermally curable liquid epoxide layer including therein at least one light absorbing material; and
   (b) irradiating the epoxide layer with laser light generated by a laser diode array and having a wavelength between 600 and 1000 nm, the epoxide layer being fomulated so that at least 15% of the radiation striking the epoxide layer is absorbed by the at least one light absorbing material in a manner to heat and cure the epoxide layer without external heating and without non-thermal curing.

* * * * *